(12) United States Patent
Shieh et al.

(10) Patent No.: US 9,437,415 B2
(45) Date of Patent: Sep. 6, 2016

(54) LAYER ALIGNMENT IN FINFET FABRICATION

(71) Applicant: Taiwan Semiconductor Manufacturing Company, Ltd., Hsin-Chu (TW)

(72) Inventors: Ming-Feng Shieh, Yongkang (TW); Kuei-Liang Lu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 120 days.

(21) Appl. No.: 13/912,936

(22) Filed: Jun. 7, 2013

(65) Prior Publication Data

US 2013/0273750 A1    Oct. 17, 2013

Related U.S. Application Data

(62) Division of application No. 13/217,702, filed on Aug. 25, 2011, now Pat. No. 9,190,261.

(51) Int. Cl.
| | | |
|---|---|---|
| H01L 21/02 | (2006.01) | |
| H01L 21/84 | (2006.01) | |
| H01L 23/544 | (2006.01) | |
| H01L 21/308 | (2006.01) | |
| H01L 21/8234 | (2006.01) | |

(52) U.S. Cl.
CPC ..... *H01L 21/02002* (2013.01); *H01L 21/3086* (2013.01); *H01L 21/823431* (2013.01); *H01L 21/845* (2013.01); *H01L 23/544* (2013.01); *H01L 2223/54426* (2013.01); *H01L 2223/54453* (2013.01); *H01L 2924/0002* (2013.01)

(58) Field of Classification Search
CPC .......... H01L 21/02002; H01L 21/845; H01L 21/82343; H01L 21/3086
USPC .................................................. 438/736, 738
See application file for complete search history.

(56) References Cited

U.S. PATENT DOCUMENTS

| | | | |
|---|---|---|---|
| 7,989,355 B2 | 8/2011 | Shieh et al. | |
| 2002/0058374 A1 | 5/2002 | Kim et al. | |
| 2004/0099638 A1* | 5/2004 | Miller | 216/94 |
| 2007/0063276 A1* | 3/2007 | Beintner et al. | 257/347 |
| 2007/0102819 A1* | 5/2007 | Goller et al. | 257/758 |
| 2007/0176305 A1* | 8/2007 | Sasaki | 257/797 |
| 2007/0178389 A1* | 8/2007 | Yoo | 430/5 |
| 2007/0249174 A1 | 10/2007 | Yang | |
| 2008/0135948 A1 | 6/2008 | Wang | |
| 2009/0125871 A1* | 5/2009 | Aton et al. | 716/21 |
| 2009/0246709 A1* | 10/2009 | Nakasugi et al. | 430/319 |
| 2010/0084715 A1* | 4/2010 | Shen et al. | 257/390 |
| 2010/0183961 A1 | 7/2010 | Shieh et al. | |
| 2010/0184287 A1 | 7/2010 | Eom | |
| 2011/0097863 A1 | 4/2011 | Shieh et al. | |
| 2011/0136340 A1 | 6/2011 | Sim et al. | |
| 2011/0156107 A1 | 6/2011 | Bohr et al. | |

* cited by examiner

*Primary Examiner* — Kevin Parendo
(74) *Attorney, Agent, or Firm* — Slater Matsil, LLP

(57) ABSTRACT

Methods for aligning layers more accurately for FinFETs fabrication. An embodiment method includes forming a first pattern in a workpiece using a first photomask, forming a second pattern in the workpiece using a second photomask, the second photomask aligned to the first pattern, and aligning a third pattern to the first and the second patterns by aligning a first feature of the third pattern to a first feature of the first pattern in a first direction, and aligning a second feature of the third pattern to a first feature of the second pattern in a second direction orthogonal to the first direction.

20 Claims, 7 Drawing Sheets

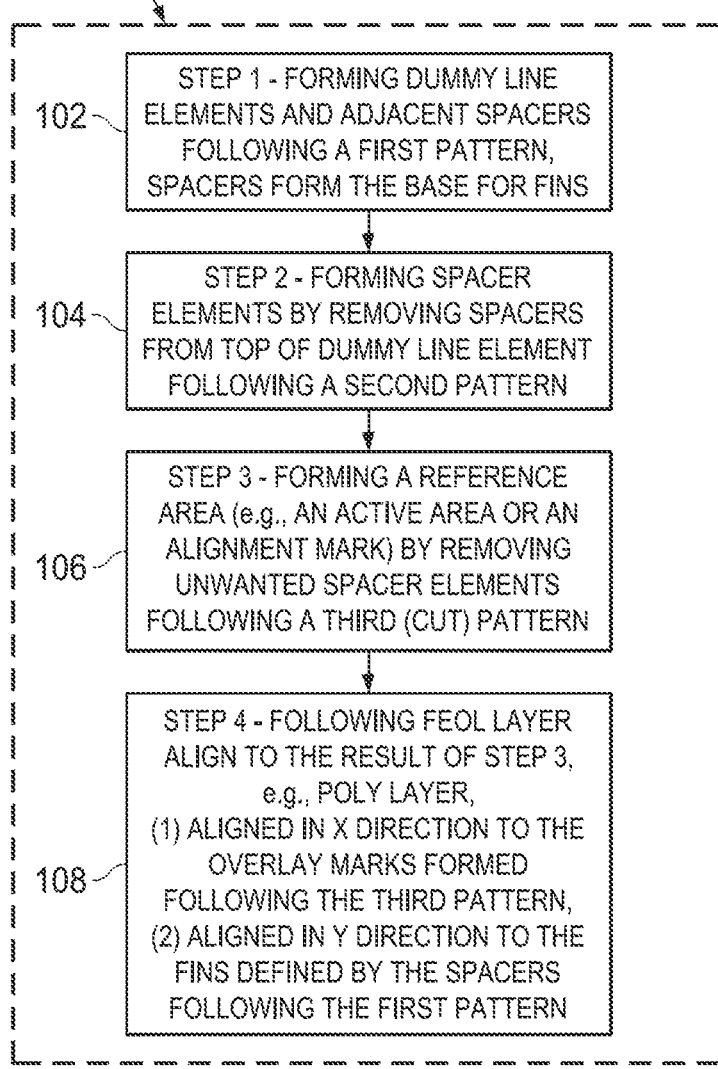

LAYER ALIGNMENT IN FINFET FABRICATION

CROSS-REFERENCE TO RELATED APPLICATIONS

This application is a divisional of co-pending U.S. patent application Ser. No. 13/217,702 filed on Aug. 25, 2011, entitled "Layer Alignment in FinFET Fabrication," which application is hereby incorporated herein by reference.

BACKGROUND

The present disclosure relates generally to semiconductor devices, and more specifically to the fabrication process of Fin field effect transistors (FinFETs) and methods of aligning approach more accurately during the fabrication process of FinFETs.

There are significant pressures on the semiconductor industry to enable smaller and smaller critical dimensions of integrated circuits. Fin field-effect transistors (FinFET) have smaller device sizes while with increased channel widths, which channels include the channels formed on the sidewalls of the fins and the channels on the top surfaces of the fins. To maximize the channel width of a FinFET, the FinFET may include multiple fins, with the ends of the fins connected to a same source and a same drain.

The fabrication process of integrated circuits (ICs) in general and FinFETs in particular include several stages, of which, the definition of a pattern associated with the circuit is of critical importance. The pattern may then be fabricated on a substrate using photolithography processes. Photolithographic methods typically include the use of successive resist layers that are latently imaged and subsequently developed and patterned over a substrate for purposes of fabricating any of several structures within the substrate. Successful semiconductor fabrication requires highly accurate alignment of features on masks used in photolithographic processes, and of their projection onto the wafer, such that successive mask-defined patterns of material are located on the wafer with accuracy in the low tens of nanometers range. The alignment process is never perfect; however, the overlay alignment measurement is critical for FET operation and must be tightly and measurably controlled during manufacture.

The front-end-of-line process (FEOL) denotes the first portion of IC manufacturing where the individual devices are patterned in the semiconductor. FEOL generally covers everything up to (but not including) the deposition of metal interconnect layers, which contains all processes of CMOS fabrication needed to form fully isolated CMOS elements. For example, a FEOL piece may include a semiconductor substrate, gates, source/drain regions, isolation regions, spacers, contacts, dielectric material, and first level metal interconnects.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 1 is a flow chart illustrating an embodiment of a method of aligning FEOL layers to the third pattern in X direction and to the first pattern in Y direction;

FIGS. 2(a)(ii)(iii) are a top view and a cross-sectional view respectively of an embodiment of a substrate corresponding to the pattern of FIG. 2(a)(i);

FIGS. 2(b)(ii)(iii) are a top view and a cross-sectional view respectively of an embodiment of a substrate corresponding to the pattern of FIG. 2(b)(i);

FIGS. 2(c)(ii)(iii) are a top view and a cross-sectional view respectively of an embodiment of a substrate corresponding to the pattern of FIG. 2(c)(i)

DETAILED DESCRIPTION OF ILLUSTRATIVE EMBODIMENTS

The making and forming of the present exemplary embodiments are discussed in detail below. It should be appreciated, however, that embodiments of the present disclosure provide many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to exemplary embodiments in a specific context, namely fabrication processes of Fin field effect transistors (FinFETs) and methods of aligning layers more accurately during the fabrication process of FinFETs.

Referring to FIG. 1, a flow chart illustrating a method 100 for fabricating a FinFET, or portion thereof, is provided. The method begins at step 102 where a first pattern is provided. The first pattern may define a configuration of dummy line structures (or features) which are used to form spacer elements (e.g., abutting the line structure). A "pattern", as described throughout the disclosure, may be provided in a layout design file (e.g., GDSII file), a photomask, formed on a substrate, and/or in other suitable forms.

Figure 2A:
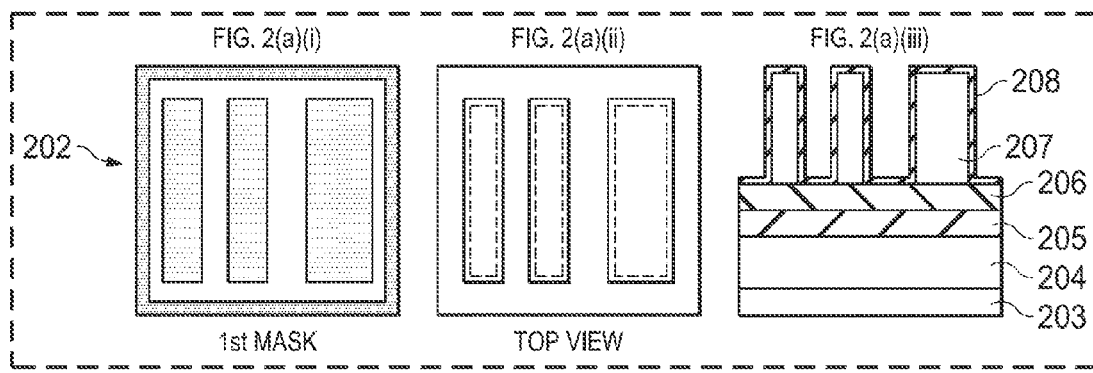
FIGS. 2(a)(i)(ii)(iii) are various views of a first pattern associated with the method of FIG. 1.

Referring to the example of FIGS. 2(a)(i), 2(a)(ii), 2(a)(iii), a first pattern is illustrated. The first pattern is exemplary only and not intended to be limiting, any configuration and quantity of elements providing a pattern is possible.

The first pattern includes a plurality of line elements determined from a layout design file and formed on a photomask 202 shown in FIG. 2(a)(i). FIG. 2(a)(iii) illustrates a substrate 203 with a pattern formed thereon following the photomask 202, while FIG. 2(a)(ii) illustrates the top view of the pattern formed shown in FIG. 2(a)(iii). The pattern shown in FIGS. 2(a)(ii) and 2(a)(iii) are formed using photolithography which exposes the substrate 203 to the mask 202. The photomask 202 may be an attenuating phase shift mask (att-PSM), an alternating PSM (alt-PSM), a chromeless phase shift mask (CPL), and/or other suitable mask types. The substrate 203 may comprise a bulk semiconductor wafer or an upper single crystal silicon layer separated from a lower single-crystal silicon layer by a buried oxide (BOX) layer.

An optional dummy layer 204 may be disposed on the substrate 203. The dummy layer 204 may include amorphous carbon, polysilicon, and/or other suitable material. Numerous other embodiments and layers may be possible. A plurality of hard mask layers 205 and 206 are disposed on the dummy layer 204. In an embodiment, hard mask layers comprise a plurality of layers formed of different materials, e.g., silicon nitride. Optionally, amorphous carbon layer may be formed over a silicon nitride layer. Plasma enhanced (PE) oxide, which may be a silicon oxide formed using plasma enhanced chemical vapor deposition (PECVD), is formed over the amorphous carbon layer. Hard mask layers may also include additional layers (not shown) comprising, but not limited to, an additional amorphous layer over silicon oxynitride layer, an additional silicon oxynitride layer over the additional amorphous carbon layer, and/or an additional bottom anti-reflective coating (ARC) over the additional silicon oxynitride layer.

Another dummy layer may be patterned to form a plurality of dummy line features 207 having the first pattern 202. The dummy line features 207 may include amorphous carbon, polysilicon, and/or other suitable material. A spacer layer may be formed on the dummy line features 207 to form spacer elements 208 abutting the dummy line features 207. The spacer elements 208 may include silicon oxide, silicon nitride, silicon oxynitride, and/or other suitable materials. The spacer elements 208 may define a critical dimension of an element to be formed on the substrate 203. For example, in an embodiment the spacer elements 208 will define a width and a pitch for elements formed. Thus, the first pattern provides dummy line features 207 which allow for adjacent spacer elements 208 to be formed, based on which the FINs will be formed.

Figure 2B:
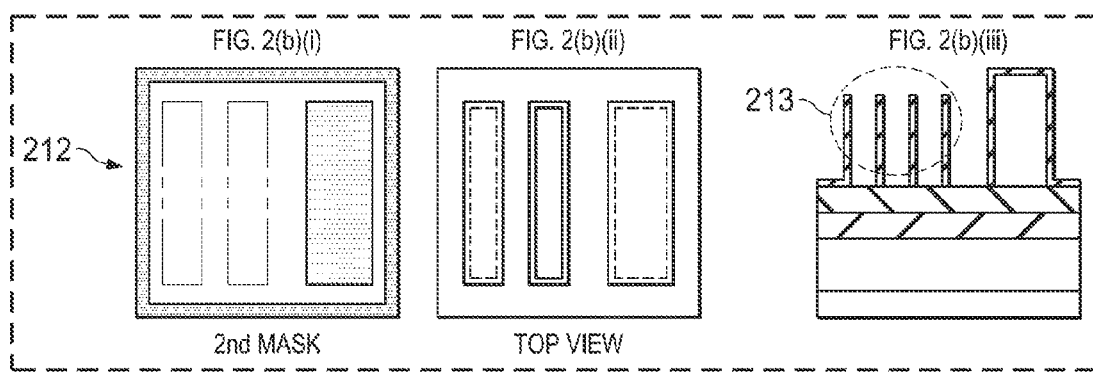
FIGS. 2(b)(i)(ii)(iii) are various views of a second pattern associated with the method of FIG. 1.

Referring back to FIG. 1, the method 100 then proceeds to step 104 where a second pattern is provided. The second pattern may remove a portion of spacer elements 208 overlying dummy line features defined by the pattern of step 102. FIGS. 2(b)(i), 2(b)(ii), 2(b)(iii), illustrate an example. In FIG. 2(b)(i), a pattern is formed on a photomask 212. The photomask 212 may be substantially similar to the photomask 202, described above with reference to FIG. 2(a)(i). FIG. 2(b)(ii) and FIG. 2(b)(iii) illustrate a top view and a cross-sectional view of a pattern formed on the substrate 203 by photolithography process following the photomask 212. The second pattern is formed by photolithography processes using the photomask 212, which defines portions of spacer elements 208 to be removed and a plurality of dummy line features 207 to be removed. As the result, a plurality of spacer elements 213 are formed, which may define a pitch/width for a FIN of FinFET.

Figure 2C:
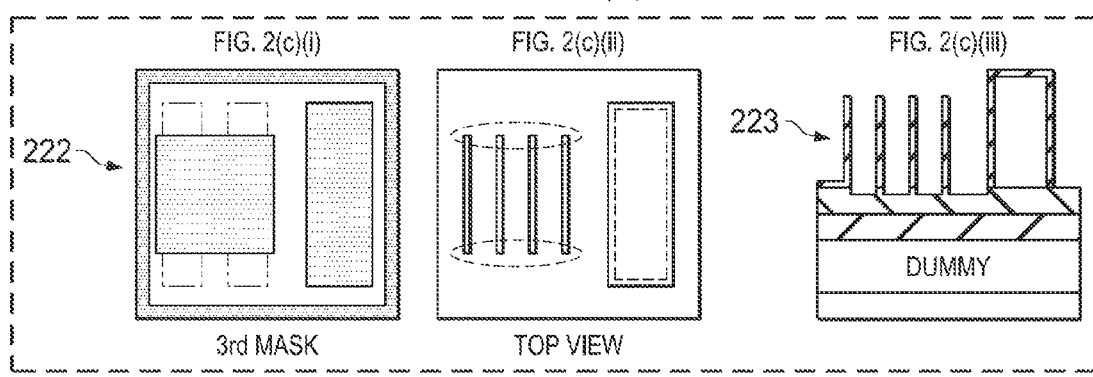
FIGS. 2(c)(i)(ii)(iii) are various views of a third pattern associated with the method of FIG. 1.

Referring back to FIG. 1, the method 100 then proceeds to step 106 where a third pattern is provided. The third pattern may be known as a cut pattern, a cut and protect pattern, or an OD pattern (e.g., defining the active area). The third pattern may remove unwanted spacer elements and/or ends of spacer elements previously formed using the patterns of steps 102 and 104. FIGS. 2(c)(i), 2(c)(ii), 2(c)(iii), illustrate an example. In FIG. 2(c)(i), a pattern is illustrated on a photomask 222. The photomask 222 may be substantially similar to the photomask 202, described above with reference to FIGS. 2(a)(i)-(iii). FIGS. 2(c)(ii), 2(c)(iii) illustrate a top view and a cross-sectional view of a pattern 222 provided on the substrate 203. The pattern 222 is formed on the substrate 203 by photolithography processes exposing the substrate 203 to the pattern 222. Thus, the pattern 222 includes spacer elements having portions at end of the dummy line features removed. One or more spacer elements have also been removed from the substrate 203 (e.g., those falling outside the defined active area). Additional steps (not shown in FIG. 1) may be taken to form a grid of FINs on the substrate 203, including: using the pattern 222 as a masking element, patterning the hard mask layers 205 and 206 using the spacer pattern 223, and patterning the dummy layer 204, which may be further used as a masking element for forming FINs in the substrate 203. Therefore, the pattern 223 includes a grid of FINs formed on the substrate 203 (not shown in the figure) in a selected area (e.g., active area), wherein the selected area is defined by the third pattern.

Figure 2D:
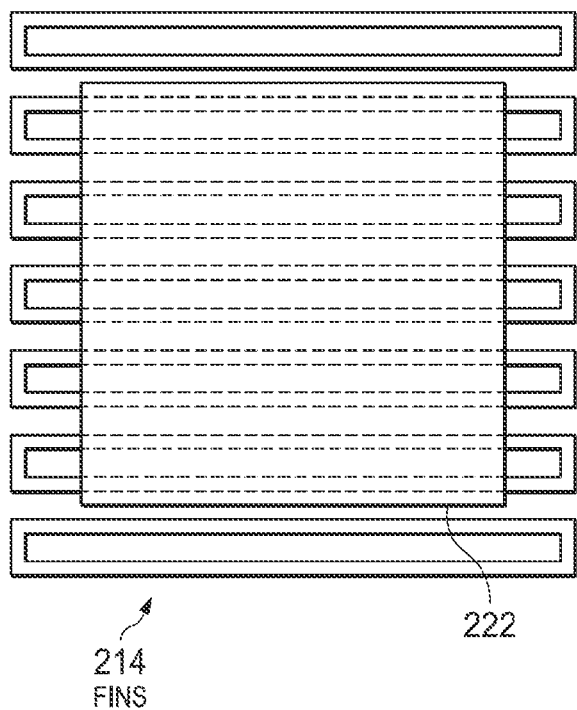
FIG. 2(d) is a top view of the third pattern on top of the fins patterned following the first pattern to define an active area.
Figure 2E:
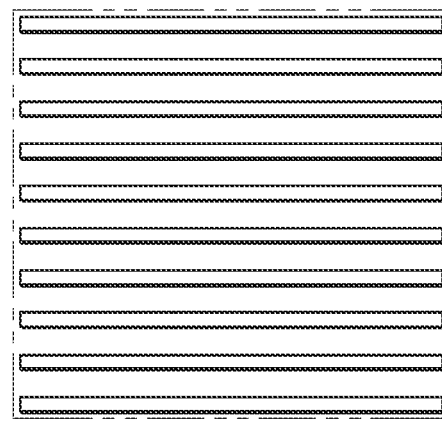
FIG. 2(e) is a top view of the active area.

FIG. 2(d) is a top view of the third pattern 222, i.e., the patterns formed from the overlay of the first, second, and third patterns described above. The number of 214 FINs and the size of the cut pattern defining an active area are all for illustrative purposes only. There may be different number of FINs and the 222 cut pattern may be of different sizes and located in different positions on top of 214 Fins. The cut pattern 222 in FIG. 2(d) is a rectangle. Other shapes of cut patterns are possible to be used as well. FIG. 2(e) is a top view of the active area resulted from applying photolithography process to the overlay of patterns shown in FIG. 2(d), where 223 shows a plurality of spacer elements in active area of the device.

After an active area is defined following the overlay of the first, the second, and the third patterns, the method 100 then proceeds to step 108 where additional FEOL layers may be formed on top of the first three layers. Additional FEOL layers may include contact layers, poly layers, and depositing a shield layer, or the like.

Figure 2F:
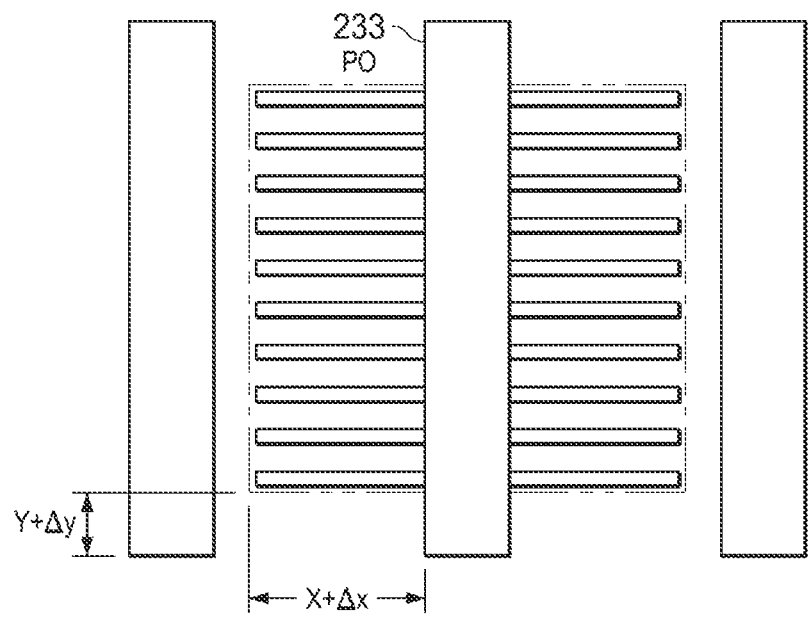
FIG. 2(f) is a top view a poly on active layout in device circuit, which active layer patterned in FIG. 2(e)

FIG. 2(f) is a top view of a poly layer on a FinFET active OD. In the X direction, the poly layer 233 is aligned to the edge of the active area defined by the third pattern. In the Y direction, the poly layer 233 is further aligned to the edge of fins defined by the spacer elements following the first pattern. The position and the size of the poly layer 233 are only for illustrative purposes. Other positions and sizes of the poly layer 233 can be used. FEOL layers other than a poly layer can be used too. Those skilled in the art can readily see many other variations while remaining within the scope of the present disclosure. The X+ΔX dimension is defined by the third pattern, extended over the edge of the poly layer 233. The Y+ΔY dimension is defined to be the distance of the poly layer 233 extended over the edge of the FIN, defined by the first pattern 202 as shown in FIG. 2(a)(i). The measurements X and Y are the desired position the poly layer 233, while ΔX and ΔY are the overlay misalignment values compared to the desired locations. The total amount Y+ΔY measures the device overlay (POLY to active layer)

performance in Y direction. The total amount X+ΔX measures device overlay (POLY to active layer) performance in X direction.

Figure 3A:
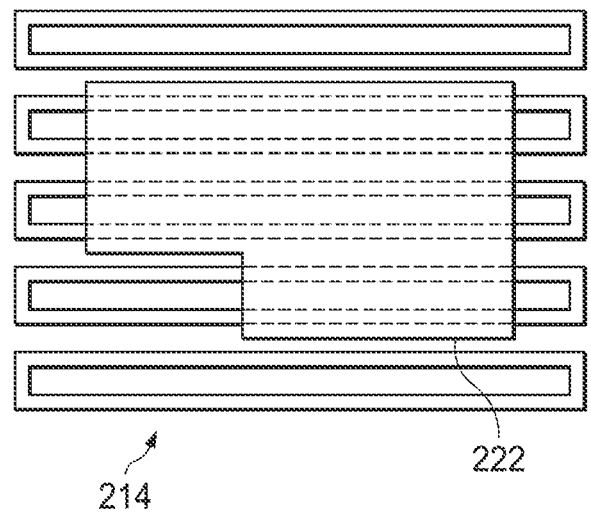
FIG. 3(a) is a top view of the third pattern on top of fins to define an active area in device circuit with a different shape.
Figure 3B:
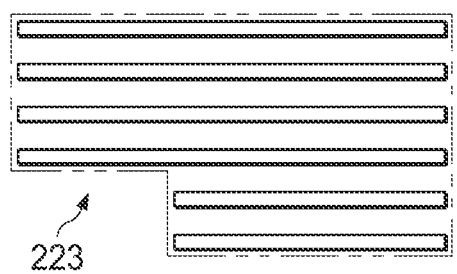
FIG. 3(b) is a top view of the active area.

Alternatively, instead of using a rectangle cut pattern 222 to define an active area as shown in FIG. 2(d), other shapes of cut patterns can be used in step 106 of the method 100. An illustrative embodiment using a polygon with 6 sides as the cut pattern is shown in FIG. 3(a). FIG. 3(a) is a top view of the third pattern on top of the fins 214 to define an active area, wherein the third pattern is of a shape of a polygon with 6 sides. There may be different number of FINs and the 222 cut pattern may be of different sizes and located in different positions on top of 214 Fins. FIG. 3(b) is a top view of the active area resulted from applying photolithography process to the overlay of patterns shown in FIG. 3(a).

Figure 3C:
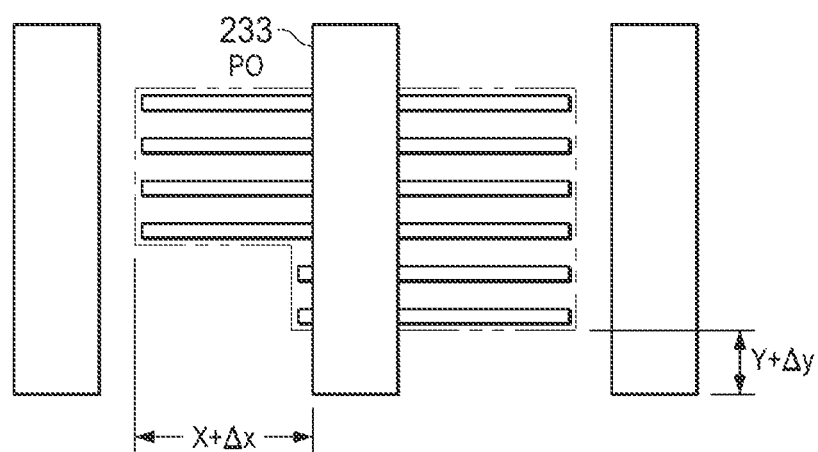
FIG. 3(c) is a top view of a poly layer on active layer patterned in FIG. 3(b)

After an active area is defined following the overlay of the first, the second, and the third patterns, the method 100 then proceeds to step 108 where additional FEOL layers may be deposited on top of the first three patterns. Additional FEOL layers may include contact layers, poly layers, a shield layer, or the like. FIG. 3(c) is a top view of a poly layer aligned to an active FinFET layer. In X direction, the poly layer 233 is aligned with the active area defined by the third pattern. In Y direction, the poly layer 233 is further aligned with the Fins defined by the spacers following the first pattern, similar to the pattern shown in FIG. 2(a)(i). The X+ΔX dimension is defined by the third pattern, extended over the edge of the poly layer 233. The Y+ΔY dimension is defined to be the distance of the poly layer 233 extended over the edge of the FIN, defined by the first pattern 202. The measurements X and Y are the desired position the poly layer 233, while ΔX and ΔY are the overlay misalignment values compared to the desired locations. The total amount Y+ΔY measures the device overlay (POLY to active layer) performance in Y direction. The total amount X+ΔX measures device overlay (POLY to active layer) performance in X direction. The position and the size of the poly layer 233 are only for illustrative purposes. Other positions and sizes of the poly layer 233 can be used. FEOL layers other than a poly layer can be used too. Those skilled in the art can readily see many other variations while remaining within the scope of the present disclosure.

Figure 4A:
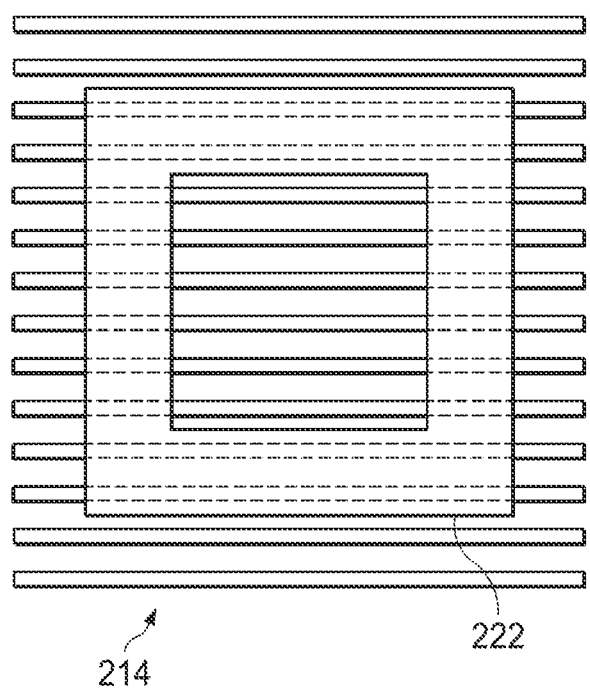
FIG. 4(a) is a top view of the third pattern on top of fins to define an overlay outer alignment mark.
Figure 4B:
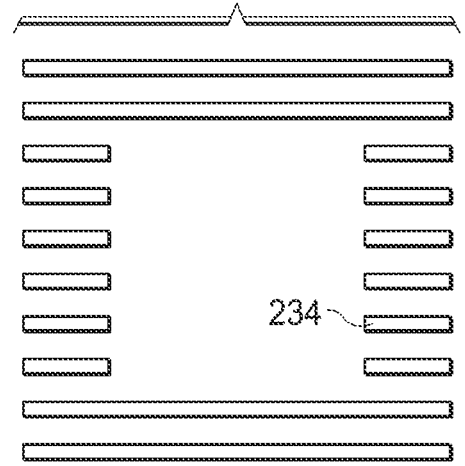
FIG. 4(b) is a top view of the outer overlay alignment mark in active layer following the first and third pattern process.

In order to align FEOL layers as shown in FIGS. 2 and 3 more accurately, alignment marks can be used to measure the position error of aligning FEOL layers in step 106 of the method 100 shown in FIG. 1. An illustrative embodiment using an overlay alignment mark with a cut pattern 222 in a monitor pad area is shown in FIG. 4(a). FIG. 4(a) is a top view of the third pattern on top of the fins 214 in a monitor pad to define an outer overlay alignment mark 234, which is a monitor pad of an overlay box, wherein the third pattern 222 is of a shape of rectangle with inside area uncovered. There may be different number of FINs and the 222 cut pattern may be of different sizes and located in different positions on top of 214 Fins. FIG. 4(b) is a top view of the outer overlay alignment mark after the third pattern process to define the active outer overlay mark for following FEOL alignment.

Figure 4C:
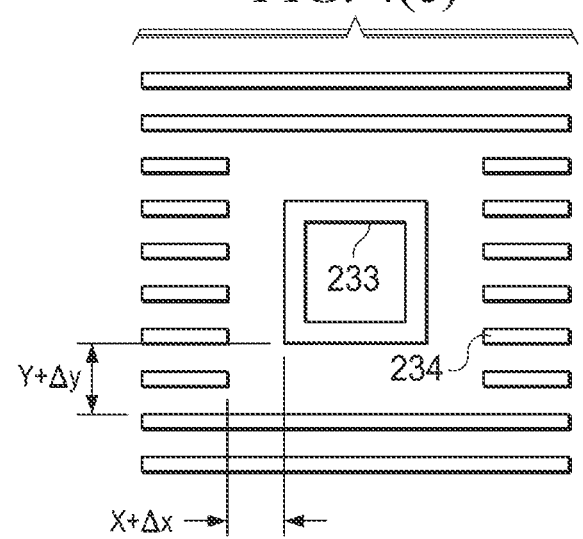
FIG. 4(c) is a top view of a poly layer(FEOL) inner overlay alignment mark align to active layer which has the same position center.

After the outer overlay alignment mark is defined following the overlay of the first, the second, and the third patterns, the method 100 in FIG. 1 then proceeds to step 108 where additional FEOL layers may be deposited on top of the first three layers. Additional FEOL layers may include contact layers, poly layers, and depositing a shield layer, or the like. FIG. 4(c) is a top view of an inner poly alignment box pattern to align a poly layer, which is an additional FEOL layer, on top of the first three layers. In X direction, the poly layer 233 is aligned with the alignment mark defined by the third pattern shown in FIG. 4(a). In Y direction, the poly layer 233 is further aligned with the alignment mark defined by the spacers following the first pattern, similar to the one shown in FIG. 2(a)(i). The X+ΔX dimension is defined by the third pattern, extended over the edge of the poly layer 233. The Y+ΔY dimension is defined to be the distance of the poly layer 233 extended over the edge of the alignment mark, defined by the first pattern 234. The measurements X and Y are the desired position the poly layer 233, while ΔX and ΔY are the resulted shifting values compared to the desired locations. The position and the size of the poly layer 233 are only for illustrative purposes. Other positions and sizes of the poly layer 233 can be used. FEOL layers other than a poly layer can be used too. Those skilled in the art can readily see many other variations while remaining within the scope of the present disclosure. The outer overlay alignment mark design described herein can reflect the device overlay more accurately, and it can further prevent the process residue or over correction effect.

In FIG. 4(c), the ΔX is defined to be the overlay shift of the poly layer 233 to the edge of the alignment mark in the horizontal direction, defined by the third pattern shown in FIG. 4(a). The ΔY is defined to be the overlay shift of the poly layer 233 to the edge of the alignment mark in the vertical direction, defined by the first pattern, similar to the one shown in FIG. 2(a)(i). ΔX and ΔY are measurements defining the intended overlay shift position of the poly layer 233 in device circuit. By aligning the FEOL layer (e.g., 233 poly layer) to the outer overlay alignment mark defined by the third pattern mask, the FEOL layout can get the real active area position and accurately reflect the device performance.

Figure 5A:
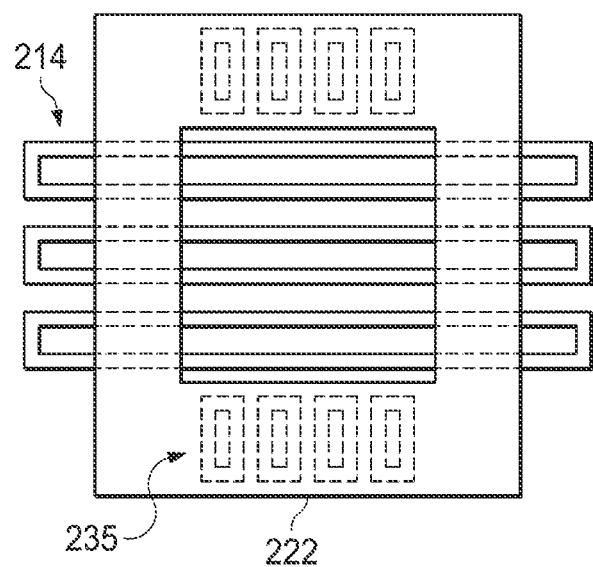
FIG. 5(a) is a top view of the third pattern on top of fins to define another alignment mark, wherein the third pattern covers some protected areas in Y-direction and cut in X-direction.
Figure 5B:
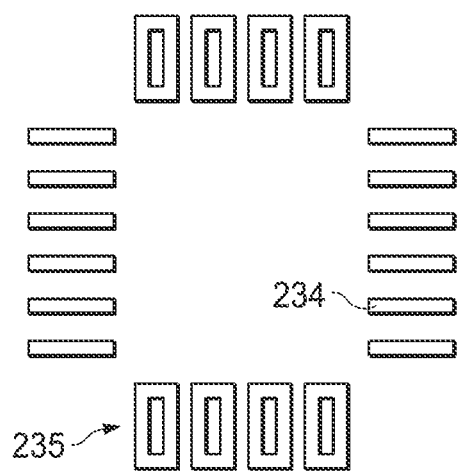
FIG. 5(b) is a top view of the active outer overlay alignment mark.

Alternatively, instead of aligning FEOL layers as shown in FIG. 4, other shapes of alignment marks can be used to align FEOL layers in step 106 of the method 100. An illustrative embodiment using an alignment mark with a cut pattern 222 is shown in FIG. 5(a). FIG. 5(a) is a top view of the third pattern on top of the fins to define an alignment mark 234, wherein the third pattern 222 is of a shape of an open rectangle area uncovered. Moreover, the cut pattern 222 covers a protected area 235 where the Fins in area 235 should be protected. There may be different number of FINs and the 222 cut pattern may be of different sizes and located in different positions on top of 214 Fins. The protected area 235 may be in Y direction rather than in X direction. FIG. 5(b) is a top view of the alignment mark resulted from applying photolithography process to the overlay of patterns shown in FIG. 5(a).

Figure 5C:
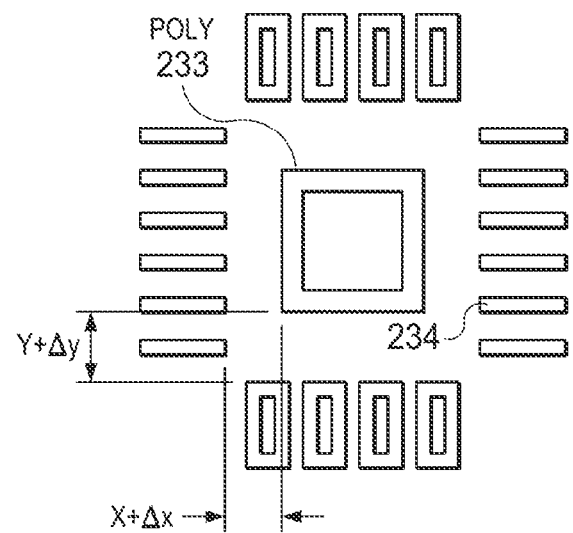
FIG. 5(c) is a top view of a poly layer (FEOL) inner overlay alignment mark align to active layer which has the same position center.

After the alignment mark is defined following the overlay of the first, the second, and the third patterns, the method 100 shown in FIG. 1 then proceeds to step 108 where additional FEOL layers may be deposited on top of the first three layers. Additional FEOL layers may include contact layers, poly layers, a shield layer, or the like. FIG. 5(c) is a top view of an alignment method to align a poly layer, which is an additional FEOL layer, on top of the first three patterns. In X direction, the poly layer 233 is aligned with the active area defined by the third pattern. In Y direction, the poly layer 233 is further aligned with the alignment mark defined by the spacers following the first pattern, similar to the one shown in FIG. 2(a)(i). The position and the size of the poly layer 233 are only for illustrative purposes. Other positions and sizes of the poly layer 233 can be used. FEOL layers other than a poly layer can be used too. Those skilled in the art can readily see many other variations while remaining within the scope of the present disclosure.

Figure 6A:
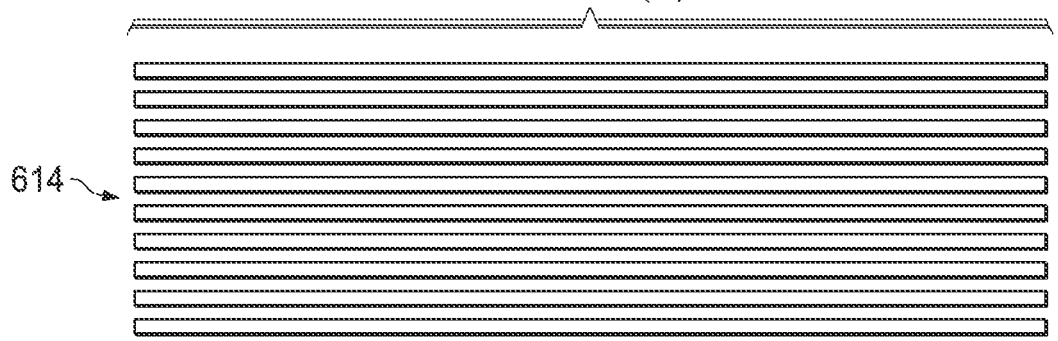
FIGS. 6(a)-6(c) illustrate one type of alignment marks used by exposure tools manufactured using processes illustrated in FIGS. 2(a) to 2(c) process.
Figure 6B:
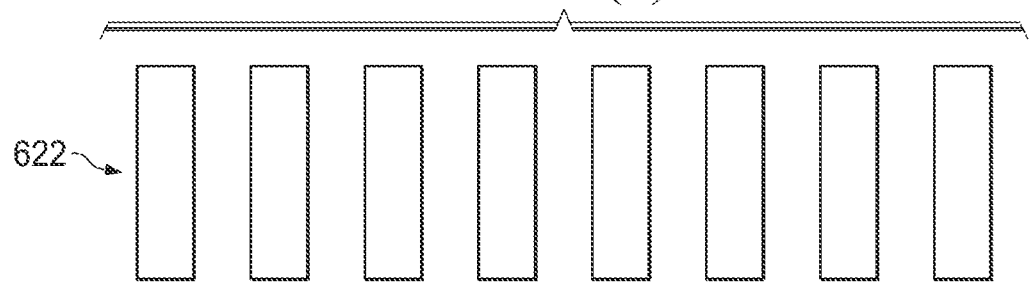
Figure 6C:
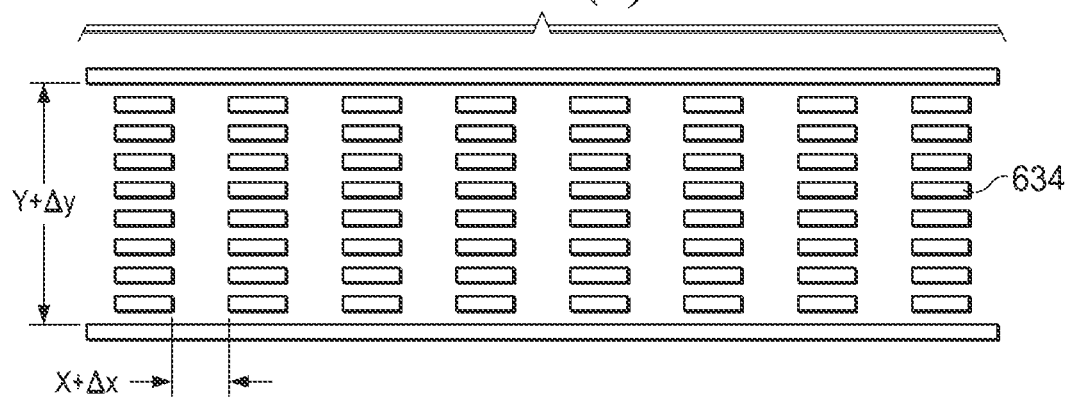

Similarly to using alignment marks to measure the position error to help to align FEOL layers more accurately as shown in FIGS. 4(a)-4(c) and FIGS. 5(a)-5(c), overlay marks can be used to achieve a similar purpose. FIGS. 6(a)-6(c) are such an illustrative example, where the overlay marks are used by metrology tools while the alignment marks are used by exposure tools. FIG. 6(a) is a top view of an FIN pattern 614 defined by the first pattern comprising a plurality of FIN lines. FIG. 6(b) is a top view of the cut pattern using in the third pattern process to define the overall overlay mark shown in FIG. 6(c) for following FEOL alignment. There may be different number of FINs 614 and the 622 cut pattern may be of different sizes and located in different positions on top of 614 FINs. After the overlay mark is defined following the overlay of the first, the second, and the third patterns, the method 100 in FIG. 1 then proceeds to step 108 where additional FEOL layers may be deposited on top of the first three layers. Additional FEOL layers may include contact layers, poly layers, and depositing a shield layer, or the like.

FIG. 6(c) is a top view of an alignment mark of exposure tools 634. The X direction edge of the alignment mark is defined by the cut pattern 622, which is the third pattern, while the Y direction edge of the alignment mark is defined by the FIN pattern 614 which is the first pattern. The overall alignment in X and Y directions are X+ΔX and Y+ΔY respectively. The alignment X and Y are the desired position, while ΔX and ΔY are the resulted shifting values compared to the desired locations. Note that the combined patterns form a gradient in the Y direction. Such a gradient can be used for machine vision patterning for exposure aligned, as is well known. A like pattern as shown in FIG. 6(c), but rotated 90° (pattern 614 and 622) can be used to form a machine vision recognizable pattern in the X direction.

The flow chart illustrating a method 100 in FIG. 1 for fabricating a FinFET, or portion thereof, is exemplary only and not intended to be limiting. There are many other possible variations where those skilled in the art can readily see while remaining within the scope of the present disclosure. An alternative method may comprise: forming a first pattern in a workpiece using a first photomask, such as a pattern defines a plurality of spacer elements abutting a plurality of dummy line features, as shown in FIG. 2(a); forming a second pattern in the workpiece using a second photomask, which is aligned to the first pattern, such as a pattern defines an active area or an alignment mark as shown in FIG. 2(d) or FIG. 4(a); aligning a third pattern to the first and second patterns by (i) aligning a first feature of the third pattern to a first feature of the first pattern in an Y direction, and (ii) aligning a second feature of the third pattern to a first feature of the second pattern in an X direction. Embodiments of the third pattern may comprise FEOL layers such as metal layers, poly layers, or shield layers, or the like, as shown in FIG. 2(f). In the X direction, aligning a first feature of the third pattern to a first feature of the first pattern is defined to be the overlay shift ΔX of the poly layer 233 to the edge of the alignment mark, defined by the third pattern shown in FIG. 4(a). In the Y direction, aligning a second feature of the third pattern to a first feature of the second pattern is defined to be the overlay shift ΔY of the poly layer 233 to the edge of the alignment mark, defined by the first pattern, similar to the one shown in FIG. 2(a)(i). X+ΔX and Y+ΔY are measurements defining the resulting position of the poly layer 233.

What is claimed is:

1. A method, comprising:
   forming a first feature in a workpiece with a first patterning process;
   after forming the first feature, forming a second feature in the workpiece with a second patterning process;
   aligning a third photomask in a first direction and a second direction, the aligning in the first direction being performed by aligning one or more features of the third photomask to the first feature formed with the first patterning process and no features formed by the second patterning process, and the aligning in the second direction being performed by aligning one or more features of the third photomask to the second feature formed with the second patterning process and no features formed by the first patterning process, the second direction is different than the first direction; and
   forming a third pattern using the third photomask;
   wherein a second pattern is formed using a second photomask, wherein the second photomask is aligned to a first pattern formed using a first photomask, and wherein the first pattern comprises a sidewall of a fin.

2. The method of claim 1, wherein the third pattern defines a FEOL layer, the FEOL layer being a shield layer or a polysilicon layer.

3. The method of claim 1, wherein the first pattern defines a plurality of spacer elements abutting a plurality of dummy line features.

4. The method of claim 1, wherein the third pattern is formed by a photolithography process.

5. The method of claim 1, further comprising trimming away end portions of spacer elements in the third pattern.

6. The method of claim 1, wherein the third pattern defines a plurality of fins.

7. The method of claim 1, wherein the first direction is orthogonal to the second direction.

8. The method of claim 1, wherein the first pattern and the second pattern are formed by a photolithography process.

9. The method of claim 1, wherein the second pattern defines an active area.

10. The method of claim 1, wherein the second pattern defines an alignment mark.

11. The method of claim 1, wherein the third pattern includes a grid of fins.

12. The method of claim 1, wherein the second pattern comprises an end of a fin.

13. The method of claim 1, wherein the first pattern defines a plurality of spacer elements abutting a plurality of dummy line features, wherein the second pattern defines an active area.

14. The method of claim 13, wherein at least one of the second photomask and the third photomask is one of an attenuating phase shift mask, an alternating phase shift mask, and a chromeless phase shift mask.

15. A method, comprising:
   forming a first feature in a workpiece with a first patterning process;
   after forming the first feature, forming a second feature in the workpiece with a second patterning process;
   aligning a third photomask in a first direction and a second direction, the aligning in the first direction being performed by aligning one or more features of the third photomask to the first feature formed with the first patterning process and no features formed by the second patterning process, and the aligning in the second direction being performed by aligning one or more features of the third photomask to the second feature formed with the second patterning process and no features formed by the first patterning process, the second direction is different than the first direction; and forming a third pattern using the third photomask;

wherein the second pattern is formed using a second photomask, wherein the second photomask is aligned to the first pattern, and wherein the second pattern comprises an end of a fin.

16. The method of claim 15, wherein the second pattern defines an alignment mark.

17. The method of claim 15, wherein the third pattern defines a FEOL layer, the FEOL layer being a shield layer or a polysilicon layer.

18. The method of claim 15, wherein the third pattern includes spacer elements having end portions removed.

19. The method of claim 15, wherein the first pattern defines a plurality of spacer elements abutting a plurality of dummy line features, wherein the second pattern defines an active area.

20. The method of claim 15, wherein the third pattern includes a grid of fins.

\* \* \* \* \*